(12) United States Patent
Huang

(10) Patent No.: US 8,031,329 B2
(45) Date of Patent: Oct. 4, 2011

(54) OVERLAY MARK, AND FABRICATION AND APPLICATION OF THE SAME

(75) Inventor: Chih-Hao Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1149 days.

(21) Appl. No.: 11/735,898

(22) Filed: Apr. 16, 2007

(65) Prior Publication Data

US 2008/0252867 A1   Oct. 16, 2008

(51) Int. Cl.
*G03B 27/32* (2006.01)

(52) U.S. Cl. ............... 355/77; 355/53; 355/55

(58) Field of Classification Search ............... 355/53, 355/55, 77
See application file for complete search history.

(56) References Cited

U.S. PATENT DOCUMENTS

| | | | |
|---|---|---|---|
| 5,635,336 A | 6/1997 | Bae | |
| 5,952,132 A | 9/1999 | King et al. | |
| 6,612,159 B1 | 9/2003 | Knutrud | |
| 6,809,420 B1 * | 10/2004 | Wong | 257/773 |
| 2002/0005594 A1 * | 1/2002 | Iwamatsu | 257/797 |

* cited by examiner

*Primary Examiner* — Edward J Glick
*Assistant Examiner* — Mesfin T Asfaw
(74) *Attorney, Agent, or Firm* — J.C. Patents

(57) ABSTRACT

An overlay mark is described, including a portion of a lower layer having two x-directional and two y-directional bar-like patterns therein, and two x-directional and two y-directional photoresist bars defined by the lithography process for defining an upper layer and surrounded by the bar-like patterns. At least one of the patterning process for defining the lower layer and the above lithography process includes two exposure steps respectively for defining a first device area and a second device area. When the patterning process includes two exposure steps, one x-directional and one y-directional bar-like patterns are defined simultaneously and the other x-directional and the other y-directional bar-like patterns are defined simultaneously. When the lithography process includes two exposure steps, one x-directional and one y-directional photoresist bars are defined simultaneously and the other x-directional and the other y-directional photoresist bars are defined simultaneously.

15 Claims, 7 Drawing Sheets

OVERLAY MARK, AND FABRICATION AND APPLICATION OF THE SAME

BACKGROUND OF THE INVENTION

1. Field of the Invention

This invention relates to an overlay mark used in IC processes, and more particularly, to an overlay mark for checking the alignment accuracy between a lower layer and a lithography process for defining an upper layer, a method for forming the same, and the application of the same in alignment accuracy checking.

2. Description of the Related Art

As the linewidth of the IC process continuously gets narrower, the alignment accuracy between a lower layer and an upper layer becomes more and more important. Therefore, an overlay mark is generally formed on a wafer for checking the alignment accuracy, wherein the most popular type of overlay mark is the so-called box-in-box (BIB) overlay mark.

A conventional BIB overlay mark is applied to cases where the lower and the upper layers each is defined by a single photomask, including four trenches in a portion of the lower layer that define a first rectangle, and four photoresist bars on the portion of the lower layer that define a second rectangle and are formed in the lithography process for defining the upper layer and surrounded by the four trenches. The four trenches are defined by a single photomask having thereon a corresponding 4-trench pattern, the four photoresist bars are defined by another single photomask having thereon a corresponding 4-bar pattern. By measuring the position of the center of the first rectangle relative to that of the second rectangle, the alignment accuracy between the lower and the upper layers can be derived.

On the other hand, as the process window gets narrower, it is more important to control the critical dimension of the semiconductor device. When an IC process need to form two areas of different pattern arrangements for a layer, two exposure steps constituting a double exposure process are usually performed to the photoresist layer in respective areas to assure that the two areas are defined in predetermined critical dimensions. When at least one of the two patterning process respectively for defining the above lower and upper layers includes two exposure steps using two photomasks, the above-mentioned conventional overlay mark is no longer suitable to use.

SUMMARY OF THE INVENTION

Accordingly, this invention provides an overlay mark for checking the alignment accuracy between a lower layer and the lithography process for defining an upper layer, wherein the lower layer has been subjected to a patterning process and at least one of the patterning process and the lithography process includes two exposure steps.

This invention also provides a method for forming the above overlay mark.

This invention also provides an method for checking alignment accuracy, which forms the above overlay mark to check the alignment accuracy between a lower layer and the lithography process for defining an upper layer in cases where at least one of the patterning process for defining the lower layer and the lithography process includes a double exposure process.

The overlay mark of this invention includes a portion of the lower layer having therein a first x-directional bar-like pattern, a first y-directional bar-like pattern, a second x-directional bar-like pattern and a second y-directional bar-like pattern, and a first x-directional photoresist bar, a first y-directional photoresist bar, a second x-directional photoresist bar and a second y-directional photoresist bar on the portion of the lower layer that are defined by the lithography process and surrounded by the bar-like patterns. At least one of the patterning process and the lithography process includes two exposure steps respectively for defining a first device area and a second device area. When the patterning process includes two exposure steps, the first x-directional bar-like pattern and the first y-directional bar-like pattern are defined simultaneously and the second x-directional bar-like pattern and the second y-directional bar-like pattern are defined simultaneously. When the lithography process includes two exposure steps, the first x-directional photoresist bar and the first y-directional photoresist bar are defined simultaneously and the second x-directional photoresist bar and the second y-directional photoresist bar are defined simultaneously.

The method for forming the overlay mark of this invention includes forming the above bar-like patterns in a portion of the lower layer during the patterning process, and forming the above photoresist bars in the lithography process. The method for checking alignment accuracy of this invention includes, after the above overlay mark is formed, measuring positions of the photoresist bars relative to the bar-like patterns for checking, in each of the first and second device areas, the alignment accuracy in the x-direction and the alignment accuracy in the y-direction between the lower layer and the lithography process.

In the above overlay mark and the methods of this invention, each bar-like pattern may include a trench in the lower layer. In some embodiments, the above bar-like patterns define a first rectangle and the above photoresist bars define a second rectangle. The arrangement of the bar-like patterns and the photoresist bars may be such that when the lower layer is fully aligned with the lithography process, the intersection of the central line between the first and second x-directional bar-like patterns and the central line between the first and second y-directional bar-like patterns coincides with the intersection of the central line between the first and second x-directional photoresist bars and the central line between the first and second y-directional photoresist bars. In such a case, it is possible that each of the first and second rectangles is a square.

In an embodiment where the above bar-like patterns define a first rectangle and the above photoresist bars define a second rectangle, the first x-directional and first y-directional bar-like patterns are defined by a first exposure step, the second x-directional and second y-directional bar-like patterns are defined by a second exposure step, the first x-directional and first y-directional photoresist bars are defined by a third exposure step, and the second x-directional and second y-directional photoresist bars are defined by a fourth exposure step. The first and third exposure steps are for defining the first device area, and the second and fourth exposure steps are for defining the second device area. In such an embodiment, it is preferred that the two edges of the first rectangle defined by the first x-directional and the first y-directional bar-like patterns correspond to the two edges of the second rectangle defined by the first x-directional and the first y-directional photoresist bars, and the two edges of the first rectangle defined by the second x-directional and the second y-directional bar-like patterns correspond to the two edges of the second rectangle defined by the second x-directional and the second y-directional photoresist bars.

In addition, the above two exposure steps may constitute a double exposure process, wherein the two exposure steps may be respectively for defining an area of dense patterns and an area of isolated patterns. The area of dense patterns may be a memory cell array area and the area of isolated patterns may be a peripheral circuit area.

By utilizing the overlay mark of this invention, it is possible to, in a case where at least one of the patterning process for defining the lower layer and the lithography process for defining the upper layer includes two exposure steps respectively for defining a first device area and a second device area, check the alignment accuracy in the x-direction and the alignment accuracy in the y-direction between the lower layer and the upper layer in each of the first and second device areas.

It is to be understood that both the foregoing general description and the following detailed description are exemplary, and are intended to provide further explanation of the invention as claimed.

BRIEF DESCRIPTION OF THE DRAWINGS

FIGS. 1A-1E illustrate a process flow of forming an overlay mark according to a first embodiment of this invention, wherein FIG. 1E illustrates the overlay mark and an exemplary use thereof.

FIGS. 2A-2D illustrate a process flow of forming an overlay mark according to a second embodiment of this invention, wherein FIG. 2D illustrates the overlay mark and an exemplary use thereof.

FIGS. 3A-3D illustrate a process flow of forming an overlay mark according to a third embodiment of this invention, wherein FIG. 3D illustrates the overlay mark and an exemplary use thereof.

DESCRIPTION OF THE PREFERRED EMBODIMENTS

Although in the following embodiments the two exposure steps included in the patterning process for defining the lower layer or in the lithography process for defining an upper layer constitute a double exposure process and the lithography process for defining an upper layer, the application of the overlay mark of this invention is not limited to such cases. For example, this invention can be applied to cases where the same layer is defined by two patterned photoresist layers that are formed at different time and are respectively defined by two exposure steps. In addition, though the bar-like patterns in each of the following embodiments of this invention are trenches formed through etching, the bar-like patterns are not limited to trenches and may alternatively be any other optically detectable patterns in this invention.

First Embodiment

Figure 1A:
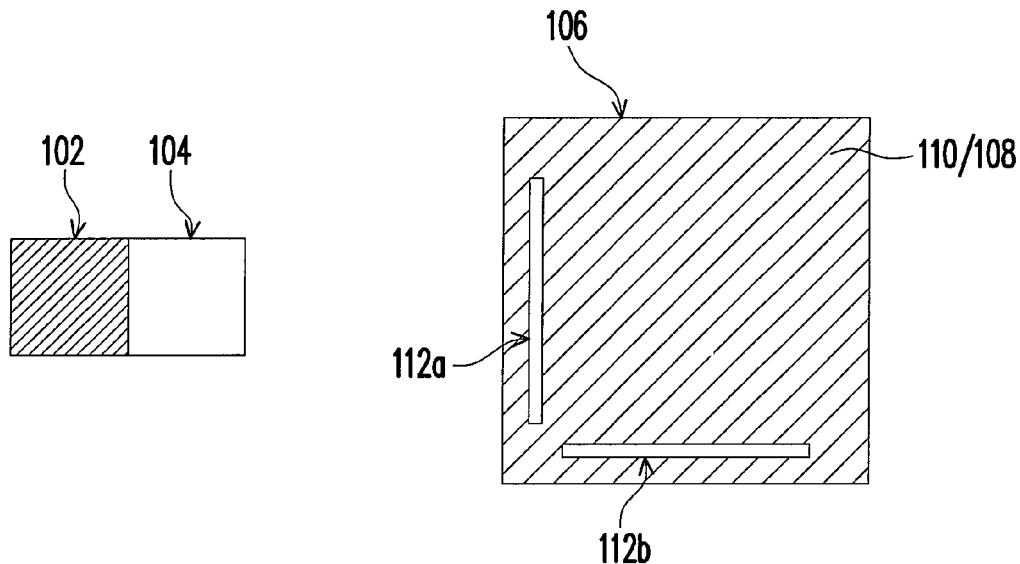
Figure 1B:
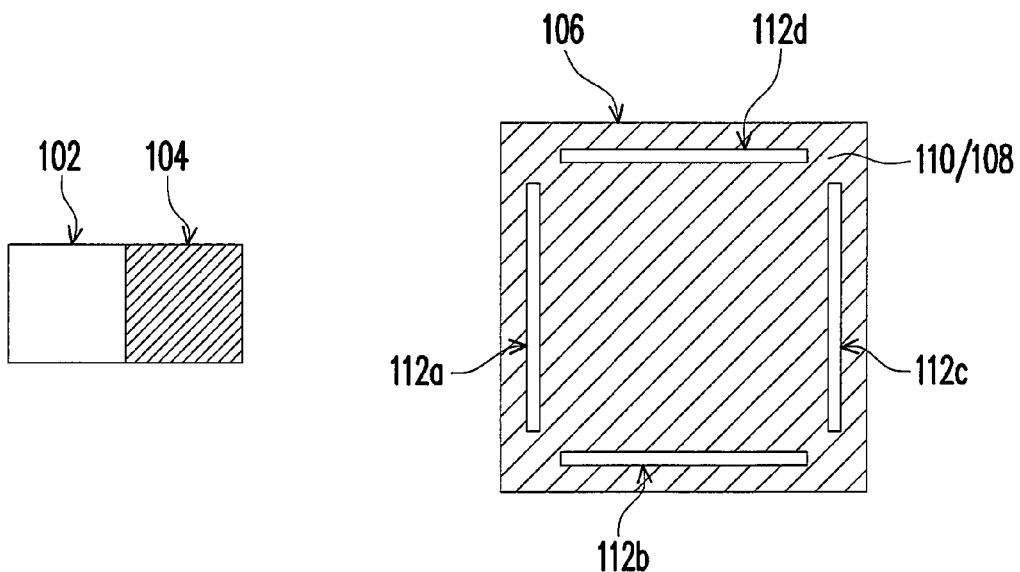
Figure 1C:
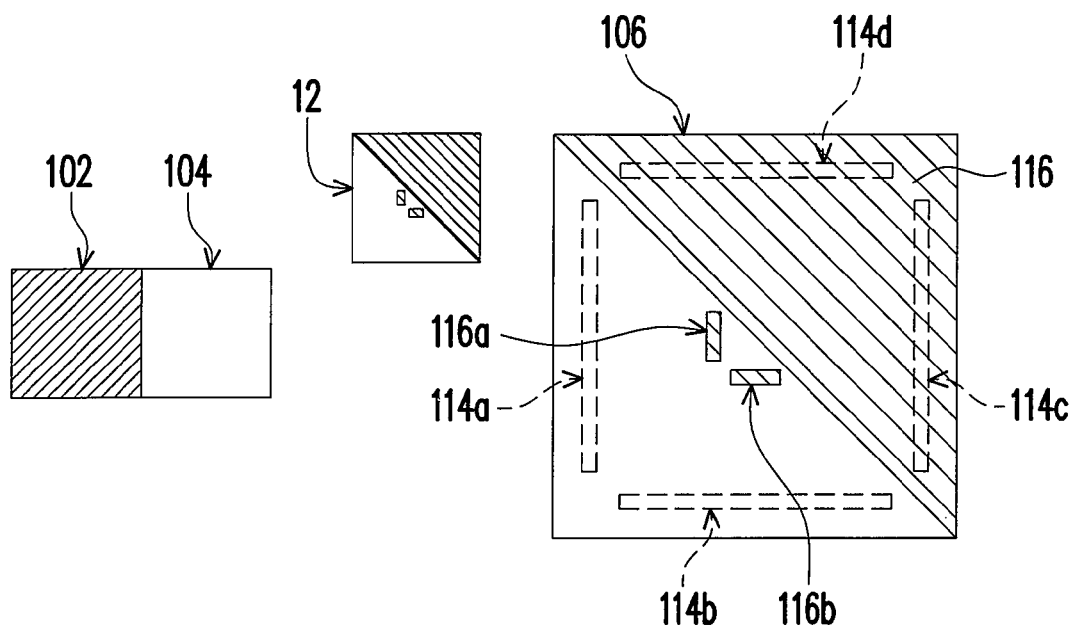
Figure 1D:
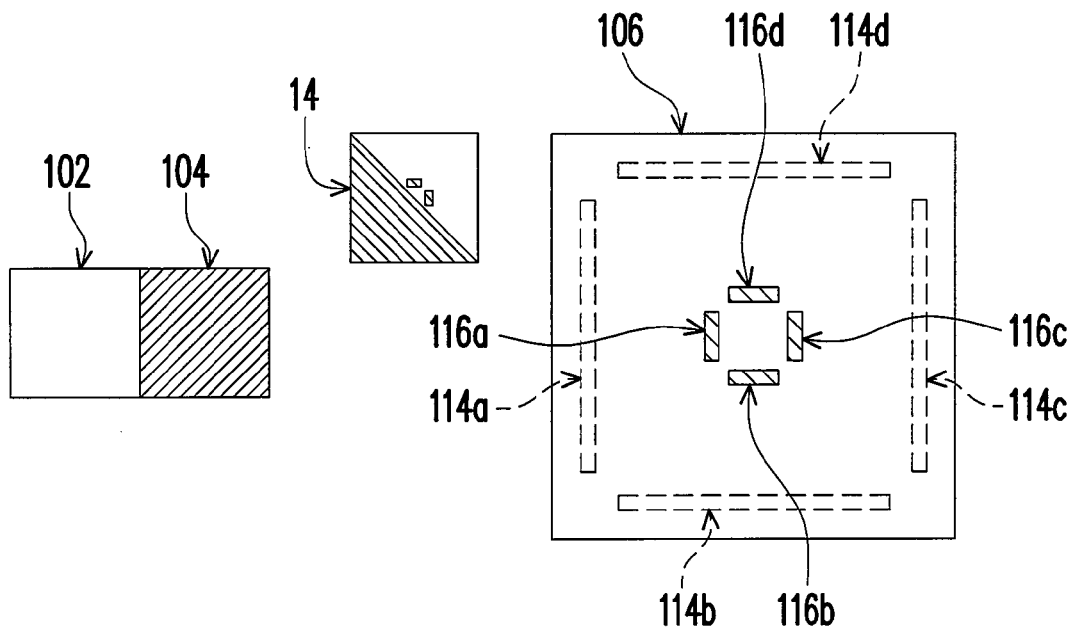
Figure 1E:
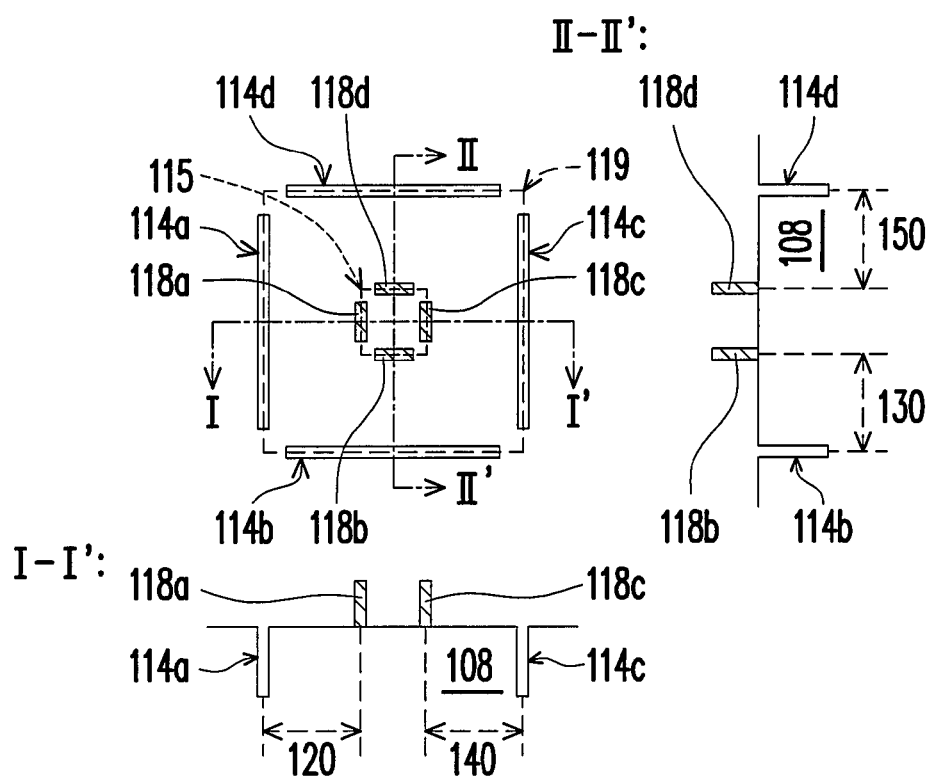

FIGS. 1A-1E illustrate a process flow of forming an overlay mark according to a first embodiment of this invention, wherein FIG. 1E illustrates the overlay mark and an exemplary use thereof. In this embodiment, each of the patterning process for defining the lower layer and the lithography process defining the upper layer includes a double exposure process.

Referring to FIG. 1A, in the first exposure step for defining a first device area 104, a first y-directional bar-like exposed region 112a and a first x-directional bar-like exposed region 112b are also formed in the positive photoresist layer 110 on a portion 108 of the lower layer in a predetermined area 106 in a non-device area, wherein the non-device area is usually the scribe line area. A first photomask used in the first exposure step has thereon the pattern to be transferred to the first device area 104 and the pattern corresponding to the first y-directional bar-like exposed region 112a and the first x-directional bar-like exposed region 112b, and is capable of masking the second device area 102. The pattern design of the photomask used in any of the later-mentioned analogous exposure steps can be understood based on the above mentioned and is not described in details.

The first device area 104 and the second device area 102 may respectively be, for example, an area of dense patterns and an area of isolated patterns. The area of dense patterns and the area of isolated patterns may respectively be, for example, a memory cell array area and a peripheral circuit area. The patterns of the lower layer may include contact opening patterns, for example, wherein the lower layer is a dielectric layer.

Referring to FIG. 1B, in the subsequent second exposure step defining the second device area 102 with a second photomask, a second y-directional bar-like exposed region 112c and a second x-directional bar-like exposed region 112d are formed in the positive photoresist layer 110 over the portion 108 of the lower layer. The photoresist material in the exposed regions 112a-112d and in the exposed regions in the device areas 102 and 104 is then removed in the subsequent development process. Thus, in the subsequent etching process patterning the lower layer in the device areas 102 and 104, a first y-directional trench 114a, a first x-directional trench 114b, a second y-directional trench 114c and a second x-directional trench 114d are formed in the portion 108 of the lower layer, as shown in FIG. 1E. The trenches 114a and 114b are defined by the first exposure step and the trenches 114c and 114d by the second exposure step, wherein the first and second exposure steps are a part of the patterning process for defining the lower layer. In addition, the positive photoresist layer 110 can be replaced by a negative photoresist layer, while the patterns of the first and second photomasks have to be designed such that the regions 112a-112d become unexposed regions and the rest of the predetermined area 106 become an exposed region.

Referring to FIG. 1C, after an upper layer (not shown) is formed, the following lithography process including a double exposure process is performed. A positive photoresist layer 116 is formed, and then a third exposure step using a third photomask is done to the first device area 104 to form exposed regions and unexposed regions in the first device area 104 and simultaneously form a first y-directional bar-like unexposed region 116a and a first x-directional bar-like unexposed region 116b in one half of the photoresist layer 116 within the predetermined area 106, wherein the pattern corresponding to the predetermined area 106 on the third photomask is like the pattern 12 in FIG. 1C.

Referring to FIG. 1D, a fourth exposure step using a fourth photomask is done to the second device area 102 to form exposed regions and unexposed regions in the second device area 102 and simultaneously form a second y-directional bar-like unexposed region 116c and a second x-directional bar-like unexposed region 116d in the other half of the photoresist layer 116 within the predetermined area 106, wherein the pattern corresponding to the predetermined area 106 on the fourth photomask is like the pattern 14 in FIG. 1D. At this moment, all the predetermined area 106 except the unexposed regions 116a-116d is an exposed region.

Besides, the above positive photoresist layer 116 can be replaced by a negative photoresist layer, while the patterns of the third and fourth photomasks have to be designed such that the regions 116a-116d become exposed regions and the rest of the predetermined area 106 become an unexposed region.

A development process is then conducted to form photoresist patterns of the first and second device areas 104 and 102 and simultaneously make the bar-like unexposed regions 116a-116d into photoresist bars 118a-118d that are surrounded by the trenches 114a-114d, as shown in FIG. 1E. The four trenches 114a-114d and the four photoresist bars 118a-118d constitute the overlay mark of the first embodiment of this invention.

Referring to FIG. 1E, in the above process, the four trenches 114a-114d define a first rectangle 115 and the four photoresist bars 118a-118d define a second rectangle 119. The trenches 114a-114d and the photoresist bars 118a-118d may be arranged such that when the lithography process is fully aligned with the lower layer, the intersection of the central line between the first and second y-directional trenches 114a and 114c and the central line between the first and second x-directional trenches 114b and 114d coincides with the intersection of the central line between the first and second y-directional photoresist bars 118a and 118c and the central line between the first and second x-directional photoresist bars 118b and 118d. In such a case, the trenches 114a-114d and the photoresist bars 118a-118d may respectively define a first square and a second square, for example.

Moreover, the upper layer is, for example, a metal layer and the positions of the trenches 114a-114d can be detected by means of the reflectivity of the metal layer. In an embodiment, the lower layer is a dielectric layer in which contact opening patterns are formed, and the upper layer is a metal layer that is partially filled into the contact openings and partially defined into conductive lines.

Referring to FIG. 1E again, based on the above overlay mark, the alignment accuracy between the pattern of the lower layer and the upper photoresist pattern in each of the first and second device areas 104 and 102 may be checked as follows. For the alignment accuracy in the first device area 104, the alignment accuracy in the x-direction between the pattern of the lower layer and the upper photoresist pattern in the first device area 104 can be known by measuring the distance 120 between the first y-directional photoresist bar 118a and the first y-directional trench 114a and then comparing the same with a predetermined standard value. The alignment accuracy in the y-direction between the pattern of the lower layer and the upper photoresist pattern in the first device area 104 can be known by measuring the distance 130 between the first x-directional photoresist bar 118b and the first x-directional trench 114b and then comparing the same with a predetermined standard value.

For the alignment accuracy in the second device area 102, the alignment accuracy in the x-direction between the pattern of the lower layer and the upper photoresist pattern in the second device area 102 can be known by measuring the distance 140 between the second y-directional photoresist bar 118c and the second y-directional trench 114c and then comparing the same with a predetermined standard value. The alignment accuracy in the y-direction between the pattern of the lower layer and the upper photoresist pattern in the second device area 102 can be known by measuring the distance 150 between the second x-directional photoresist bar 118d and the second x-directional trench 114d and then comparing the same with a predetermined standard value. The above alignment accuracies are namely the alignment accuracies between the lower layer and the upper layer later defined by the lithography process in the first and second device areas 104 and 102.

Second Embodiment

Figure 2A:
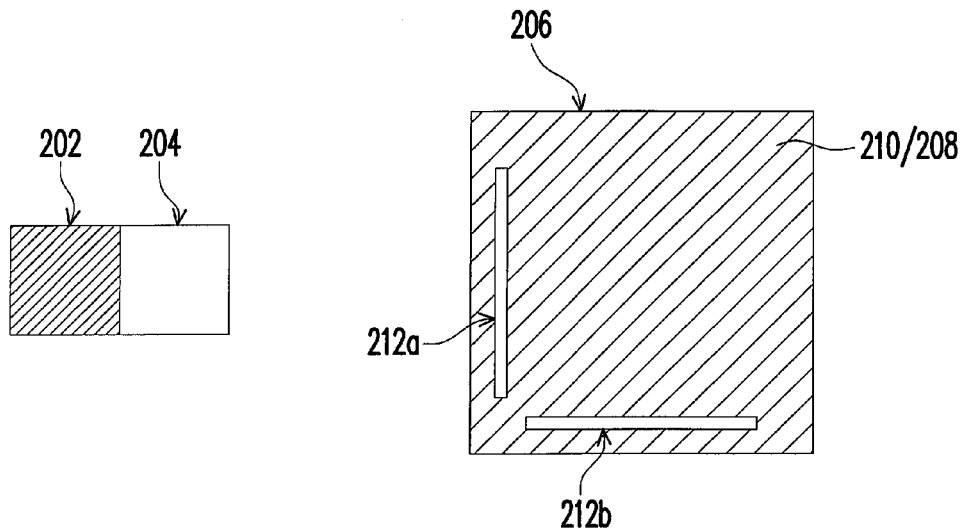
Figure 2B:
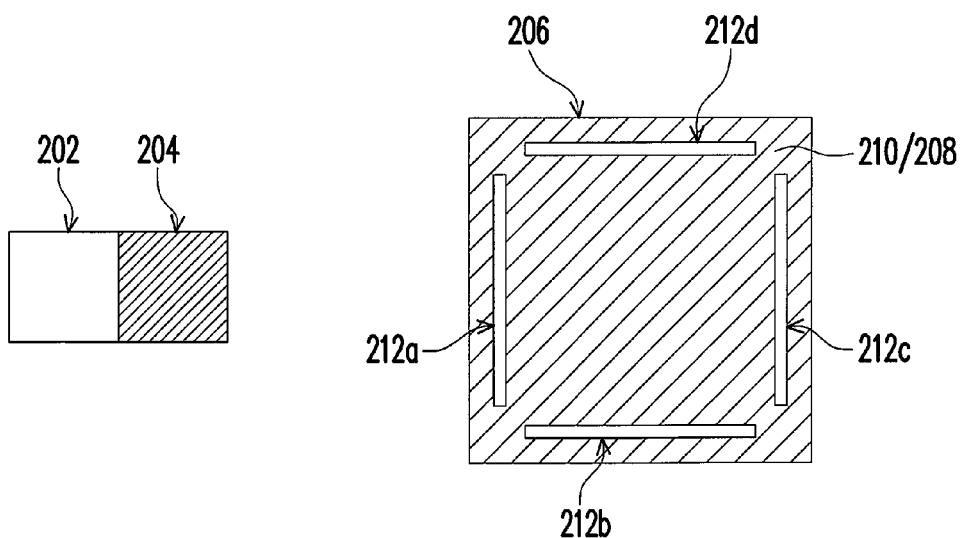
Figure 2C:
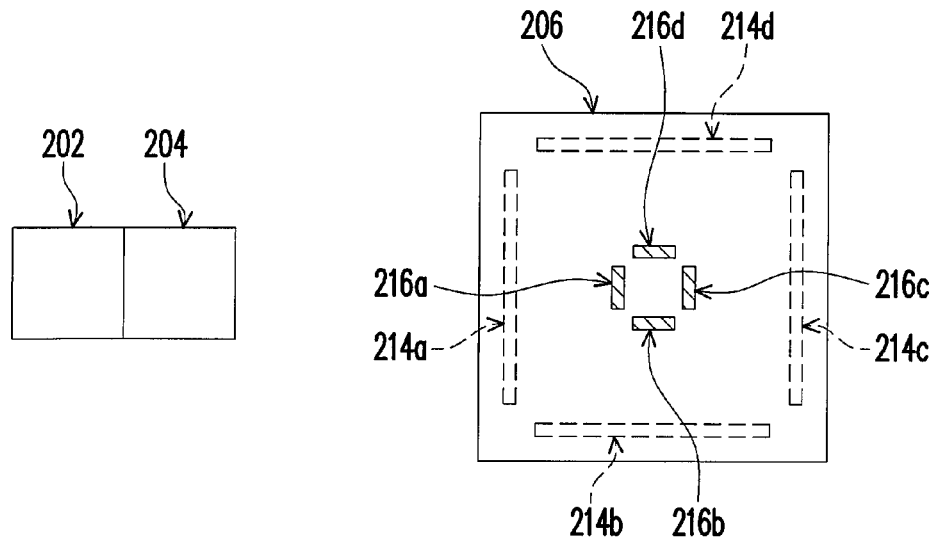
Figure 2D:
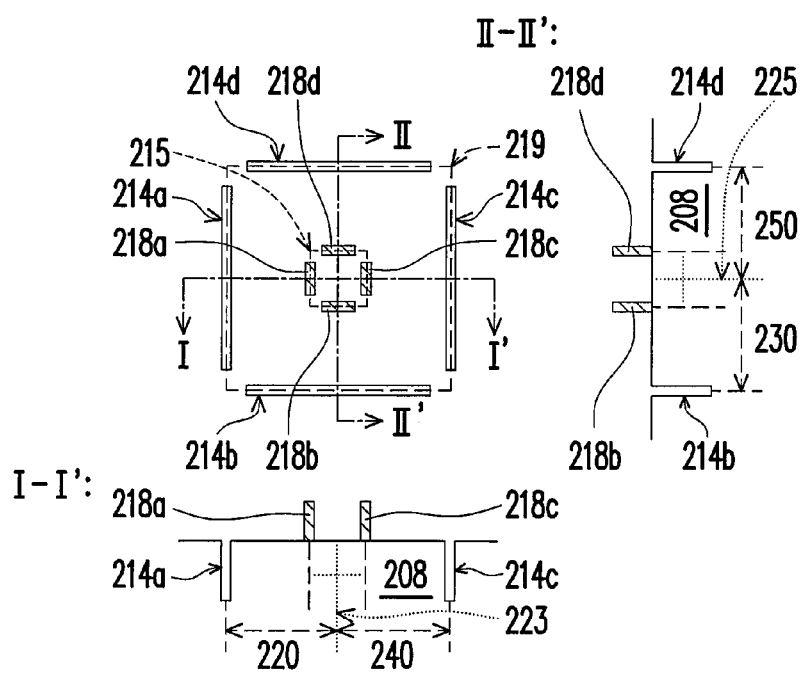

FIGS. 2A-2D illustrate a process flow of forming an overlay mark according to the second embodiment of this invention, wherein FIG. 2D illustrates the overlay mark and an exemplary use thereof. In this embodiment, only the patterning process of the lower layer includes a double exposure process, and the lithography process for defining the upper layer only one exposure step that defines the first and second device areas.

Referring to FIG. 2A, in the first exposure step that defines a first device area 204 using a first photomask, a first y-directional bar-like exposed region 212a and a first x-directional bar-like exposed region 212b are also formed in the positive photoresist layer 210 on a portion 208 of the lower layer in a predetermined area 206 in a non-device area.

Referring to FIG. 2B, in the subsequent second exposure step that defines the second device area 202 by a second photomask, a second y-directional bar-like exposed region 212c and a second x-directional bar-like exposed region 212d are formed in the positive photoresist layer 210 over the portion 208 of the lower layer. The photoresist material in the exposed regions 212a-212d and in the exposed regions in the device areas 202 and 204 is then removed in the subsequent development process. Thus, in the subsequent etching process patterning the lower layer in the device areas 202 and 204, a first y-directional trench 214a, a first x-directional trench 214b, a second y-directional trench 214c and a second x-directional trench 214d are formed in the portion 208 of the lower layer, as shown in FIG. 2D. The trenches 214a and 214b are defined by the first exposure step and the trenches 214c and 214d by the second exposure step, wherein the first and second exposure steps are a part of the patterning process of the lower layer. In addition, the positive photoresist layer 210 may be replaced by a negative photoresist layer, while the corresponding change of the process is as described in the first embodiment.

Referring to FIG. 2C, after an upper layer (not shown) is formed, another positive photoresist layer is formed, and then a third exposure step using a third photomask is done to the first and second device areas 204 and 202 to form exposed regions and unexposed regions in the first and second device areas 204 and 202 and simultaneously form a first y-directional bar-like unexposed region 216a, a first x-directional bar-like unexposed region 216b, a second y-directional bar-like unexposed region 216c and a second x-directional bar-like unexposed region 216d in the positive photoresist layer in the predetermined area 206, wherein all the predetermined area 206 except the bar-like unexposed regions 216a-216d is an exposed region. The above positive photoresist layer 210 may also be replaced by a negative photoresist layer, while the pattern of the corresponding photomask has to be complementary to that of the above third photomask.

A development process is then conducted to form photoresist patterns of the first and second device areas 204 and 202 and simultaneously make the bar-like unexposed regions 216a-216d into photoresist bars 218a-218d that are surrounded by the trenches 214a-214d, as shown in FIG. 2D. The four trenches 214a-214d and the four photoresist bars 218a-218d constitute the overlay mark of the second embodiment of this invention.

Referring to FIG. 2D, in the above process, the four trenches 214a-214d define a first rectangle 215 and the four photoresist bars 218a-118d define a second rectangle 219. The trenches 214a-214d and the photoresist bars 218a-218d may be arranged such that when the lithography process is fully aligned with the lower layer, the intersection of the central line between the first and second y-directional trenches 214a and 214c and the central line between the first and second x-directional trenches 214b and 214d coincides with the intersection of the central line between the first and second y-directional photoresist bars 218a and 218c and the central line between the first and second x-directional photoresist bars 218b and 218d. In such a case, the trenches 214a-214d and the photoresist bars 218a-118d may respectively define a first square and a second square, for example.

Referring to FIG. 2D again, based on the above overlay mark, the alignment accuracy between the pattern of the lower layer and the upper photoresist pattern in each of the first and second device areas 204 and 202 may be checked as follows. For the alignment accuracy in the first device area 204, the alignment accuracy in the x-direction between the pattern of the lower layer and the upper photoresist pattern in the first device area 204 can be known by measuring the distance 220 between the first y-directional trench 214a and the central line 223 of the first and second y-directional photoresist bars 218a and 218c and then comparing the same with a predetermined standard value. The alignment accuracy in the y-direction between the pattern of the lower layer and the upper photoresist pattern in the first device area 204 can be known by measuring the distance 230 between the first x-directional trench 214b and the central line 225 of the first and second x-directional photoresist bars 218b and 218d and then comparing the same with a predetermined standard value.

For the alignment accuracy in the second device area 202, the alignment accuracy in the x-direction between the pattern of the lower layer and the upper photoresist pattern in the second device area 202 can be known by measuring the distance 240 between the second y-directional trench 214c and the central line 223 of the first and second y-directional photoresist bars 218a and 218c and then comparing the same with a predetermined standard value. The alignment accuracy in the y-direction between the pattern of the lower layer and the upper photoresist pattern in the second device area 202 can be known by measuring the distance 250 between the second x-directional trench 214d and the central line 225 of the first and second x-directional photoresist bars 218b and 218d and then comparing the same with a predetermined standard value. The above alignment accuracies are namely the alignment accuracies between the lower layer and the upper layer later defined by the lithography process in the first and second device areas 204 and 202.

Third Embodiment

Figure 3A:
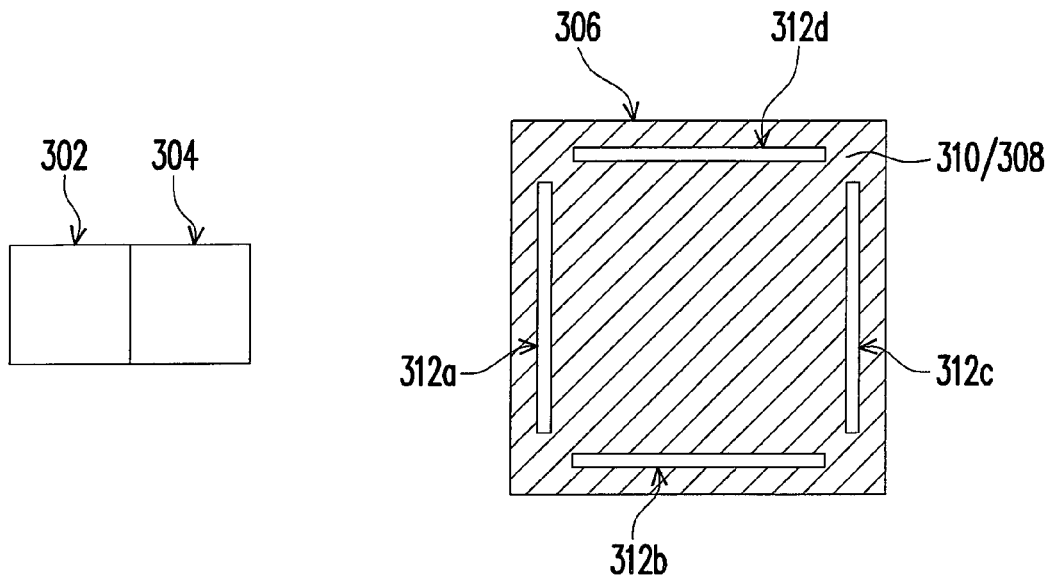
Figure 3B:
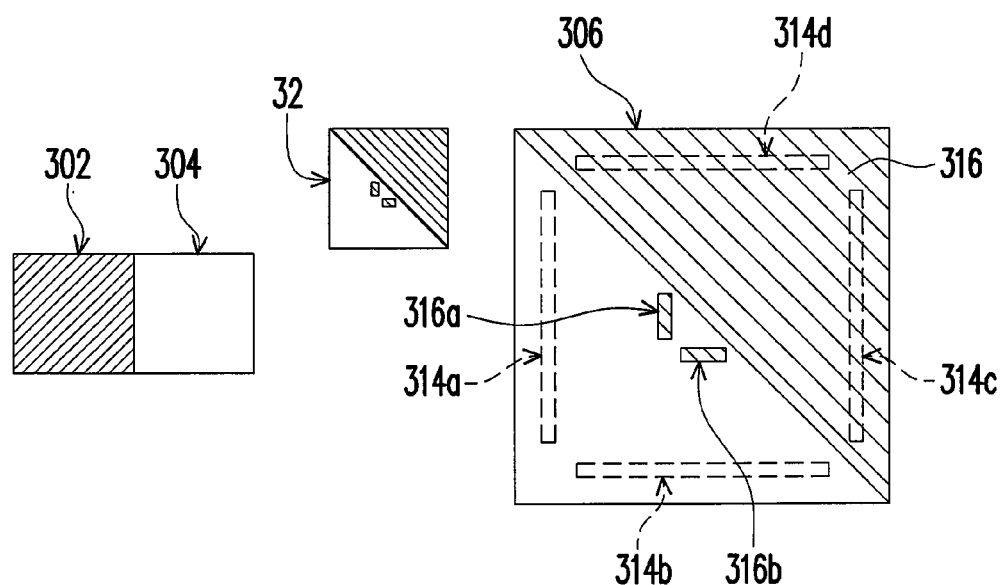
Figure 3C:
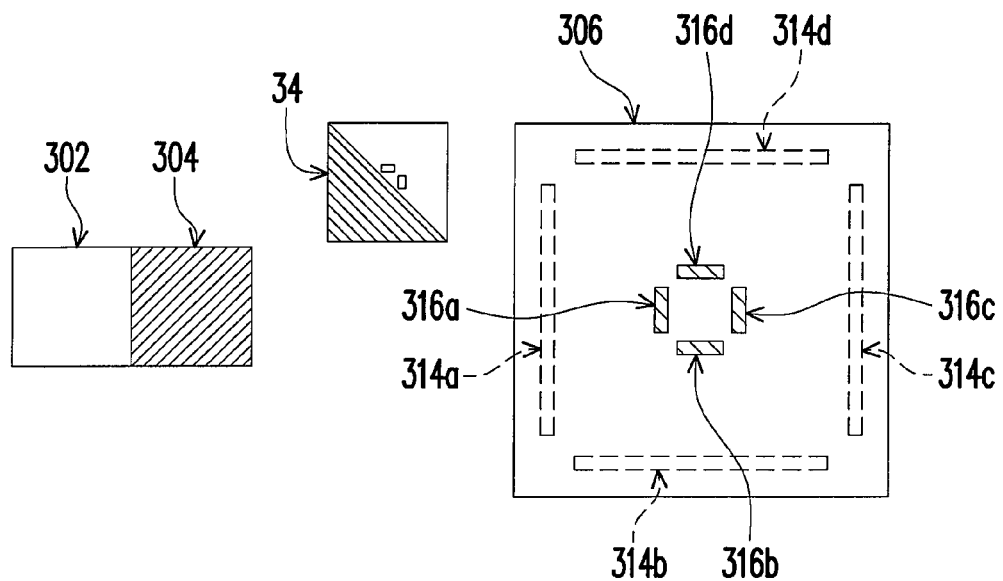
Figure 3D:
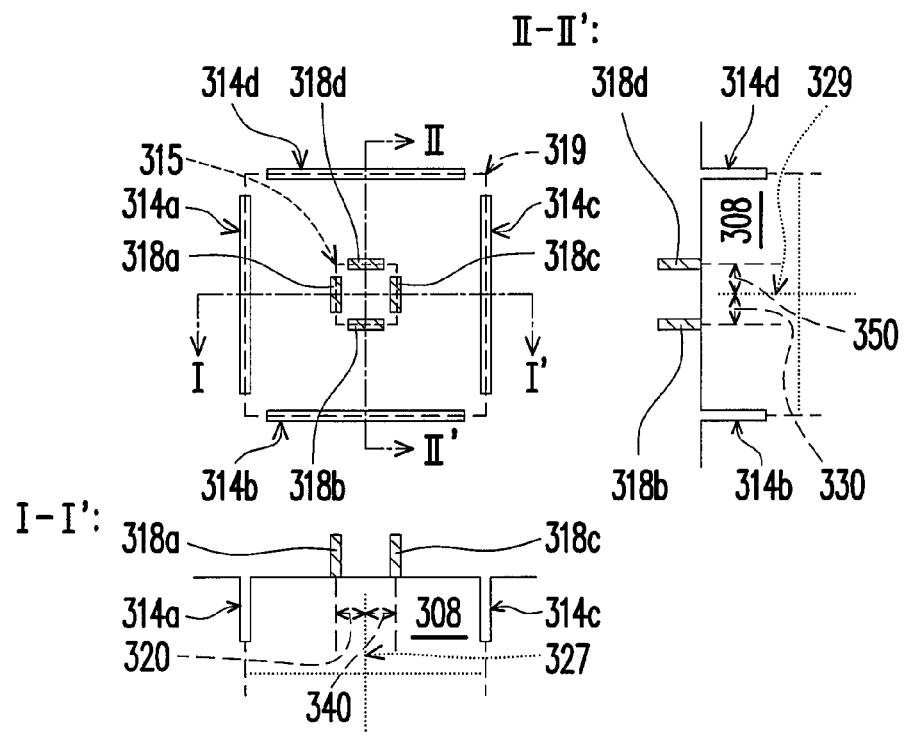

FIGS. 3A-3D illustrate a process flow of forming an overlay mark according to the third embodiment of this invention, wherein FIG. 3D illustrates the overlay mark and an exemplary use thereof. In this embodiment, only the lithography process for defining the upper layer includes a double exposure process, and the patterning process of the lower layer includes only one exposure step that defines the first and the second device areas.

Referring to FIG. 3A, in the exposure step that defines the first and the second device areas 304 and 302 using a first photomask, a first y-directional bar-like exposed region 312a, a first x-directional bar-like exposed region 312b, a second y-directional bar-like exposed region 312c and a second x-directional bar-like exposed region 312d are also formed in the positive photoresist layer 310 on a portion 308 of the lower layer in a predetermined area 306 in a non-device area. The photoresist material in the exposed regions 312a-312d and in the exposed regions in the device areas 302 and 304 is then removed in the subsequent development process. Thus, in the subsequent etching process patterning the lower layer in the device areas 302 and 304, a first y-directional trench 314a, a first x-directional trench 314b, a second y-directional trench 314c and a second x-directional trench 314d are formed in the portion 308 of the lower layer, as shown in FIG. 3D. The above positive photoresist layer 310 may be replaced by a negative photoresist layer, while the pattern of the corresponding photomask has to be complementary to that of the above first photomask.

Referring to FIG. 3B, after an upper layer (not shown) is formed, the following lithography process including a double exposure process is performed. A positive photoresist layer 316 is formed, and then a second exposure step using a second photomask is done to the first device area 304 to form exposed regions and unexposed regions in the first device area 304 and simultaneously form a first y-directional bar-like unexposed region 316a and a first x-directional bar-like unexposed region 316b in one half of the photoresist layer 316 within the predetermined area 306, wherein the pattern corresponding to the predetermined area 306 on the second photomask is like the pattern 32 in FIG. 3B.

Referring to FIG. 3C, a third exposure step using a third photomask is done to the second device area 302 to form exposed regions and unexposed regions in the second device area 302 and simultaneously form a second y-directional bar-like unexposed region 316c and a second x-directional bar-like unexposed region 316d in the other half of the photoresist layer 316 within the predetermined area 306, wherein the pattern corresponding to the predetermined area 306 on the third photomask is like the pattern 34 in FIG. 3C. At this moment, all the predetermined area 306 except the unexposed regions 316a-316d is an exposed region.

A development process is then conducted to form photoresist patterns of the first and second device areas 304 and 302 and simultaneously make the bar-like unexposed regions 316a-316d into photoresist bars 318a-318d that are surrounded by the trenches 314a-314d, as shown in FIG. 3D. The four trenches 314a-d and the four photoresist bars 318a-318d constitute the overlay mark of the third embodiment of this invention.

Referring to FIG. 3D, in the above process, the four trenches 314a-314d define a first rectangle 315 and the four photoresist bars 318a-318d define a second rectangle 319. The trenches 314a-314d and the photoresist bars 318a-318d may be arranged such that when the lithography process is fully aligned with the lower layer, the intersection of the central line between the first and second y-directional trenches 314a and 314c and the central line between the first and second x-directional trenches 314b and 314d coincides with the intersection of the central line between the first and second y-directional photoresist bars 318a and 318c and the central line between the first and second x-directional photoresist bars 318b and 318d. In such a case, the four trenches 314a-314d and the four photoresist bars 318a-318d may respectively define a first square and a second square, for example.

Referring to FIG. 3D again, based on the above overlay mark, the alignment accuracy between the pattern of the lower layer and the upper photoresist pattern in each of the first and second device areas 304 and 302 may be checked as follows. For the alignment accuracy in the first device area 304, the alignment accuracy in the x-direction between the pattern of the lower layer and the upper photoresist pattern in the first device area 304 can be known by measuring the distance 320 between the first y-directional photoresist bar 318a and the central line 327 of the first and second y-directional trenches 314a and 314c and then comparing the same with a predetermined standard value. The alignment accuracy in the y-direction between the pattern of the lower layer and the upper photoresist pattern in the first device area 304 can be known by measuring the distance 330 between the first x-directional photoresist bar 318b and the central line 329 of the first and second x-directional trenches 314b and 314d and then comparing the same with a predetermined standard value.

For the alignment accuracy in the second device area 302, the alignment accuracy in the x-direction between the pattern of the lower layer and the upper photoresist pattern in the second device area 302 can be known by measuring the distance 340 between the second y-directional photoresist bar 318a and the central line 327 of the first and second y-directional trenches 314a and 314c and then comparing the same with a predetermined standard value. The alignment accuracy in the y-direction between the pattern of the lower layer and the upper photoresist pattern in the second device area 302 can be known by measuring the distance 350 between the second x-directional photoresist bar 318d and the central line 329 of the first and second x-directional trenches 314b and 314d and then comparing the same with a predetermined standard value. The above alignment accuracies are namely the alignment accuracies between the lower layer and the upper layer later defined by the lithography process in the first and second device areas 304 and 302.

Accordingly, by utilizing the overlay mark of this invention, it is possible to, in a case where at least one of the patterning process of the lower layer and the lithography process for defining the upper layer includes two exposure steps for defining a first device area and a second device area respectively, check the alignment accuracy in the x-direction and the alignment accuracy in the y-direction between the lower layer and the upper layer in each of the first and second device areas.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming an overlay mark that is for checking alignment accuracy between a patterned lower layer and an upper layer defined by a lithography process, wherein the lower layer has been subjected to a patterning process, comprising:

during the patterning process, forming a first x-directional bar pattern, a first y-directional bar pattern, a second x-directional bar pattern and a second y-directional bar pattern in a portion of the lower layer; and in the lithography process, forming a first x-directional photoresist bar, a first y-directional photoresist bar, a second x-directional photoresist bar and a second y-directional photoresist bar that are located over the portion of the lower layer and surrounded by the bar patterns, wherein at least one of the patterning process and the lithography process includes two exposure steps respectively for defining a first device area and a second device area, when the patterning process includes two exposure steps, the first x-directional bar pattern and the first y-directional bar pattern are defined simultaneously by one of the two exposure steps and the second x-directional bar pattern and the second y-directional bar pattern are defined simultaneously by the other of the two exposure steps, and when the lithography process includes two exposure steps, the first x-directional photoresist bar and the first y-directional photoresist bar are defined simultaneously by one of the two exposure steps and the second x-directional photoresist bar and the second y-directional photoresist bar are defined simultaneously by the other of the two exposure steps.

2. The method of claim 1, wherein each bar pattern comprises a trench in the lower layer.

3. The method of claim 1, wherein the bar patterns define a first rectangle and the photoresist bars define a second rectangle.

4. The method of claim 3, wherein
a central line between the first and second x-directional bar patterns and a central line between the first and second y-directional bar patterns have a first intersection;
a central line between the first and second x-directional photoresist bars and a central line between the first and second y-directional photoresist bars have a second intersection; and
when the lower layer is fully aligned with the lithography process, the first and second intersections coincide with each other.

5. The method of claim 4, wherein when the lower layer is fully aligned with the lithography process, each of the first and second rectangles is a square.

6. The method of claim 3, wherein
the first x-directional and first y-directional bar patterns are defined by a first exposure step, the second x-directional and second y-directional bar patterns are defined by a second exposure step, the first x-directional and first y-directional photoresist bars are defined by a third exposure step, and the second x-directional and second y-directional photoresist bars are defined by a fourth exposure step;
the first and third exposure steps are for defining the first device area, and the second and fourth exposure steps are for defining the second device area; and
two edges of the first rectangle defined by the first x-directional bar pattern and the first y-directional bar pattern correspond to two edges of the second rectangle defined by the first x-directional photoresist bar and the first y-directional photoresist bar, and two edges of the first rectangle defined by the second x-directional bar pattern and the second y-directional bar pattern correspond to two edges of the second rectangle defined by the second x-directional photoresist bar and the second y-directional photoresist bar.

7. The method of claim 1, wherein the two exposure steps constitute a double exposure process.

8. The method of claim 7, wherein the two exposure steps are respectively for defining an area of dense patterns and an area of isolated patterns.

9. The method of claim 8, wherein the area of dense patterns comprises a memory cell array area and the area of isolated patterns a peripheral circuit area.

10. A method for checking alignment accuracy between a lower layer and an upper layer defined by a lithography process, wherein the lower layer has been subjected to a patterning process and at least one of the patterning process and the lithography process includes a double exposure process that includes two exposure steps respectively for defining a first device area and a second device area, comprising:

forming an overlay mark, comprising:

during the patterning process, forming a first x-directional bar pattern, a first y-directional bar pattern, a second x-directional bar pattern and a second y-directional bar pattern in a portion of the lower layer; and in the lithography process, forming a first x-directional photoresist bar, a first y-directional photoresist bar, a second x-directional photoresist bar and a second y-directional photoresist bar that are located over the portion of the lower layer and surrounded by the bar patterns, wherein when the patterning process includes two exposure steps, the first x-directional bar pattern and the first y-directional bar pattern are defined simultaneously by one of the two exposure steps and the second x-directional bar pattern and the second y-directional bar pattern are defined simultaneously by the other of the two exposure steps, and when the lithography process includes two exposure steps, the first x-directional photoresist bar and the first y-directional photoresist bar are defined simultaneously by one of the two exposure steps and the second x-directional photoresist bar and the second y-directional photoresist bar are defined simultaneously by the other of the two exposure steps; and measuring positions of the photoresist bars relative to the bar patterns for checking, in each of the first and second device areas, the alignment accuracy in the x-direction and the alignment accuracy in the y-direction between the lower layer and the lithography process.

11. The method of claim 10, wherein each bar pattern comprises a trench in the lower layer.

12. The method of claim 10, wherein the bar patterns define a first rectangle and the photoresist bars define a second rectangle.

13. The method of claim 12, wherein a central line between the first and second x-directional bar patterns and a central line between the first and second y-directional bar patterns have a first intersection;

a central line between the first and second x-directional photoresist bars and a central line between the first and second y-directional photoresist bars have a second intersection; and when the lower layer is fully aligned with the lithography process, the first and second intersections coincide with each other.

14. The method of claim 13, wherein when the lower layer is fully aligned with the lithography process, each of the first and second rectangles is a square.

15. The method of claim 12, wherein the first x-directional and first y-directional bar patterns are defined by a first exposure step, the second x-directional and second y-directional bar patterns are defined by a second exposure step, the first x-directional and first y-directional photoresist bars are defined by a third exposure step, and the second x-directional and second y-directional photoresist bars are defined by a fourth exposure step;

the first and third exposure steps are for defining the first device area, and the second and fourth exposure steps are for defining the second device area; and two edges of the first rectangle defined by the first x-directional bar pattern and the first y-directional bar pattern correspond to two edges of the second rectangle defined by the first x-directional photoresist bar and the first y-directional photoresist bar, and two edges of the first rectangle defined by the second x-directional bar pattern and the second y-directional bar pattern correspond to two edges of the second rectangle defined by the second x-directional photoresist bar and the second y-directional photoresist bar.

* * * * *